(12) United States Patent
Harada et al.

(10) Patent No.: US 7,977,141 B2
(45) Date of Patent: Jul. 12, 2011

(54) SOLID-STATE IMAGE PICKUP DEVICE AND METHOD OF MANUFACTURING THE SAME

(75) Inventors: Tsubasa Harada, Kanagawa (JP); Atsushi Murakoshi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 12/551,084

(22) Filed: Aug. 31, 2009

(65) Prior Publication Data
US 2010/0181637 A1 Jul. 22, 2010

(30) Foreign Application Priority Data
Jan. 20, 2009 (JP) .................. 2009-009561

(51) Int. Cl.
*H01L 21/00* (2006.01)
(52) U.S. Cl. ............... 438/69; 438/60; 438/70; 438/75; 438/144; 438/401; 438/459; 438/469; 257/459; 257/E21.158; 257/E31.124; 257/E31.022; 257/E31.255; 257/E31.232; 257/E31.234; 257/E31.258; 257/E31.291; 257/E31.444; 257/E31.097; 257/E27.013; 257/E27.134; 257/E27.133; 257/E27.135
(58) Field of Classification Search .................. None
See application file for complete search history.

(56) References Cited

U.S. PATENT DOCUMENTS

| 2005/0104148 | A1 | 5/2005 | Yamamoto et al. |
| 2006/0197007 | A1 | 9/2006 | Iwabuchi et al. |
| 2008/0237762 | A1* | 10/2008 | Swain et al. ................. 257/432 |
| 2009/0057539 | A1 | 3/2009 | Iwabuchi et al. |
| 2009/0065681 | A1 | 3/2009 | Iwabuchi et al. |

FOREIGN PATENT DOCUMENTS

| JP | 2005-150463 | 6/2005 |
| JP | 2007-13089 | 1/2007 |

\* cited by examiner

*Primary Examiner* — Charles D Garber
*Assistant Examiner* — Yasser A Abdelaziez
(74) *Attorney, Agent, or Firm* — Oblon, Spivak, McClelland, Maier & Neustadt, L.L.P.

(57) ABSTRACT

A method of manufacturing a solid-state image pickup device according to an embodiment includes forming first and second holes in a semiconductor substrate, forming insulating films on surfaces of the first and second holes, forming a contact and an alignment mark by embedding a conducting material in the first and second holes, forming a photodiode in the semiconductor substrate, forming a wiring layer including a connecting part for connecting to the contact and a wiring for connecting to the connecting part, bonding a supporting substrate on the wiring layer, exposing the contact and the alignment mark on the surface of the semiconductor substrate by reducing the semiconductor substrate in thickness, and forming a filter and a lens on the photodiode based on the alignment mark.

9 Claims, 11 Drawing Sheets

SOLID-STATE IMAGE PICKUP DEVICE AND METHOD OF MANUFACTURING THE SAME

CROSS-REFERENCE TO RELATED APPLICATIONS

This application is based upon and claims the benefit of priority from prior Japanese Patent Application No. 2009-009561, filed on Jan. 20, 2009, the entire contents of which are incorporated herein by reference.

BACKGROUND

Conventionally, a rear plane irradiation type CMOS (complementary metal oxide semiconductor) solid-state image pickup device is known, the solid-state image pickup device including an interlayer insulating layer formed on a supporting substrate in which an embedded wiring layer is embedded, a semiconductor layer formed on the interlayer insulating layer, and a surface insulating film formed on the semiconductor layer. The solid-state image pickup device is, for example, disclosed in JP-A-2007-13089.

A photodiode, an alignment mark and the like are formed in the semiconductor layer. The alignment mark is used as a criterion of alignment when a patterning of the side of the surface insulating film of the semiconductor layer is carried out, and in addition to the above, it can be also used as an electrode for test when configured as an electrode.

BRIEF SUMMARY

A method of manufacturing a solid-state image pickup device according to one embodiment includes forming first and second holes in a semiconductor substrate, forming insulating films on surfaces of the first and second holes, forming a contact and an alignment mark by embedding a conducting material in the first and second holes, forming a photodiode in the semiconductor substrate, forming a wiring layer including a connecting part for connecting to the contact and a wiring for connecting to the connecting part, bonding a supporting substrate on the wiring layer, exposing the contact and the alignment mark on the surface of the semiconductor substrate by reducing the semiconductor substrate in thickness, and forming a filter and a lens on the photodiode based on the alignment mark.

A solid-state image pickup device according to another embodiment includes a supporting substrate a wiring layer formed on the supporting substrate, in which a wiring is formed, a connecting part formed in the wiring layer, whose end portion connects to the wiring, a semiconductor layer formed in the wiring layer, in which a light receiving part is formed, a contact formed of polycrystal silicon in the semiconductor layer, which connects to an other end portion opposite to the end portion of the connecting part, an alignment mark formed in the semiconductor layer, which includes the same material as the contact and an insulating film formed in the side of the contact and the alignment mark.

A solid-state image pickup device according to another embodiment includes a supporting substrate, a wiring layer formed on the supporting substrate, in which a wiring is formed, a connecting part formed in the wiring layer, whose end portion connects to the wiring, a semiconductor layer formed in the wiring layer, in which a light receiving part is formed, a contact formed of a metal or a metal compound in the semiconductor layer, which connects to an other end portion opposite to the end portion of the connecting part, an alignment mark formed in the semiconductor layer, which includes the same material as the contact and an insulating film formed in the side of the contact and the alignment mark.

DETAILED DESCRIPTION

Comparative Example

Figure 4:
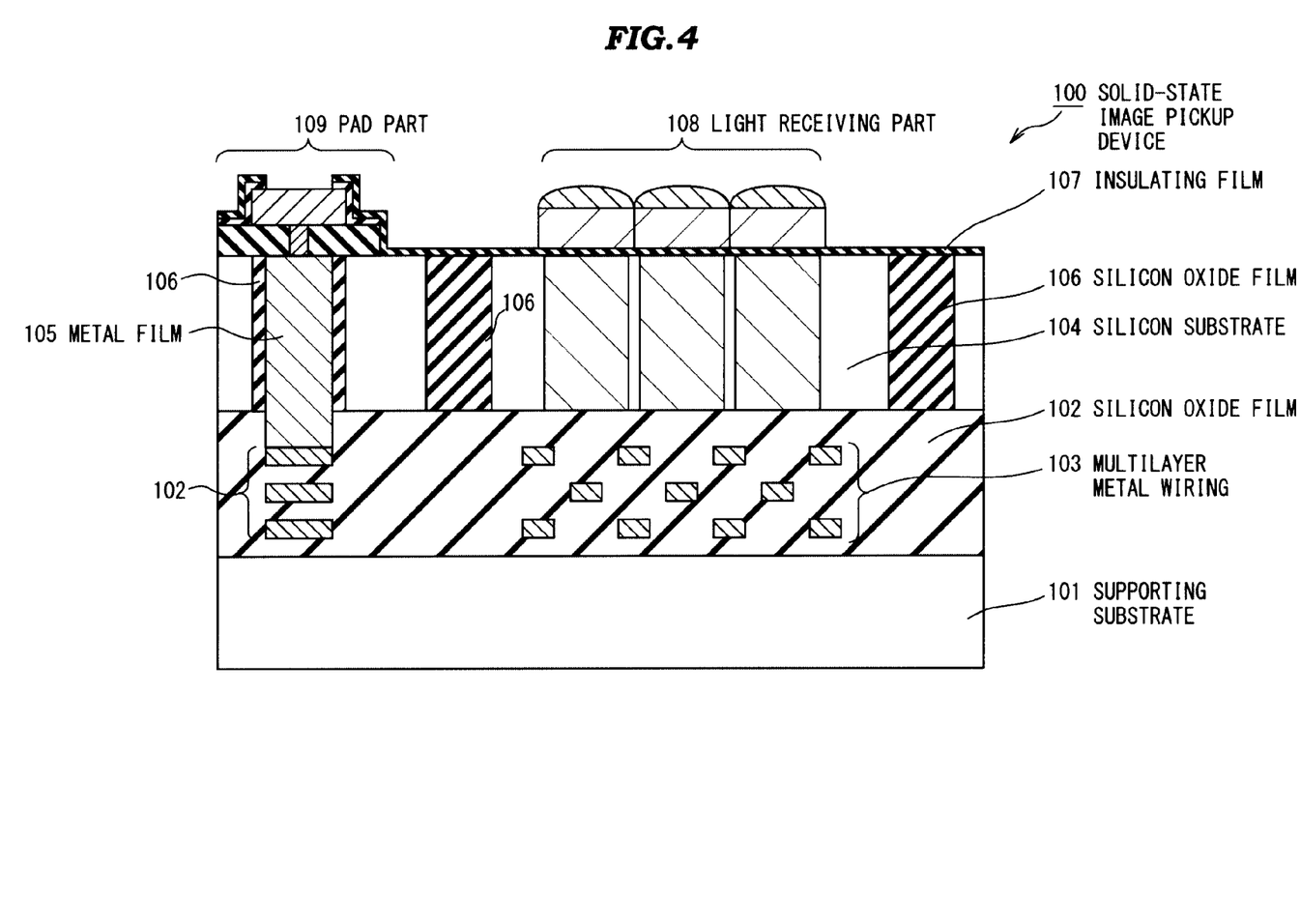
FIG. 4 is a cross-sectional view schematically showing a solid-state image pickup device according to a comparative example.

FIG. 4 is a cross-sectional view schematically showing a solid-state image pickup device according to the comparative example. The solid-state image pickup device is a rear plane irradiation type CMOS solid-state image pickup device.

As shown in FIG. 4, the solid-state image pickup device 100 according to the comparative Example is schematically configured to include a supporting substrate 101 formed of silicon, a silicon oxide film 102 formed on the supporting substrate 101, in which a multilayer metal wiring 103 is embedded, a silicon substrate 104 formed on the silicon oxide film 102, a metal film 105 as the contact which is further embedded in a silicon oxide film 106 embedded in the silicon substrate 104 in the depth direction, the silicon oxide film 106 as alignment marks embedded in the silicon substrate 104 in the depth direction, a insulating film 107 formed on the silicon substrate 104, a light receiving part 108 having a photodiode formed in the silicon substrate 104 and filters and lenses formed on the silicon substrate 104, and a pad part 109 electrically connecting to the metal film 105.

Hereinafter, an example of a method of manufacturing a solid-state image pickup device according to the comparative example will be explained.

(Manufacturing of Solid-State Image Pickup Device)

FIGS. 5A to 5F are cross-sectional views schematically showing a manufacturing process of the solid-state image pickup device according to the comparative example.

Figure 5A:
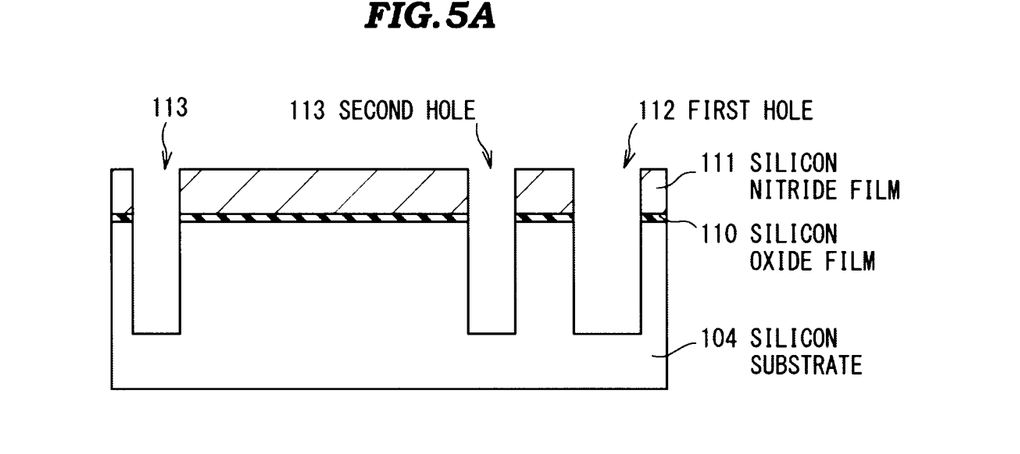
FIGS. 5A to 5F are cross-sectional views schematically showing a manufacturing process of the solid-state image pickup device according to the comparative example.

First, the surface of the silicon substrate 104 is oxidized by an oxidation method so as to form a silicon oxide film 110. Subsequently, a silicon nitride film 111 is formed on the silicon oxide film 110 by a CVD (Chemical Vapor Deposition) method. Subsequently, a resist pattern which has a pattern corresponding to the contact and the alignment marks is formed on the silicon nitride film 111 by the photolithographic method.

Next, as shown in FIG. 5A, first and second holes 112, 113 are formed in the silicon substrate 104, where the first hole 112 is formed in a place corresponding to the contact and the second holes 113 is formed in a place corresponding to the alignment marks. Particularly, the silicon nitride film 111 and the silicon oxide film 110 are etched by a RIE (Reactive Ion Etching) method under conditions selective to the resist pattern. Subsequently, the resist pattern is eliminated, and the silicon substrate 104 is etched by the RIE method under conditions selective to the silicon nitride film 111 so as to form the first and second holes 112, 113.

Next, the silicon oxide film 106 is embedded in the first and second holes 112, 113 by the CVD method.

Figure 5B:
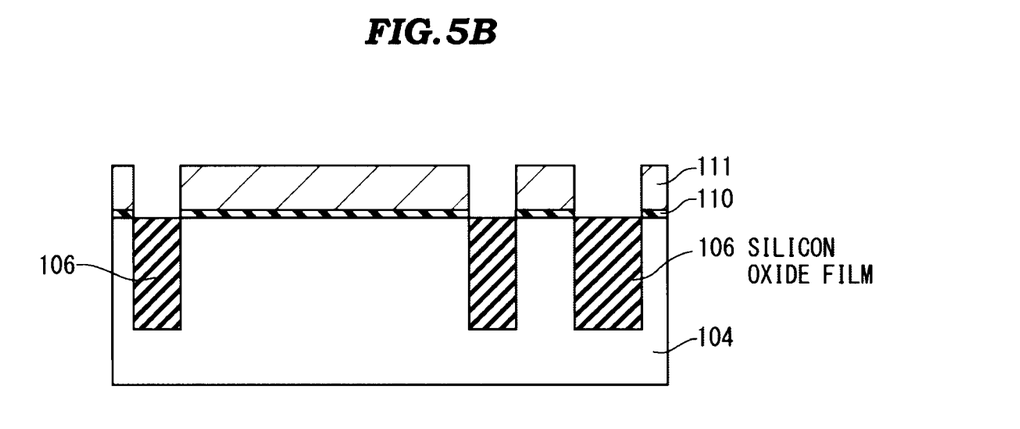

Next, as shown in FIG. 5B, the silicon oxide film 106 on the silicon nitride film 111 is eliminated by a CMP (Chemical Mechanical Polishing) method, the height of the silicon oxide film 106 in the first and second holes 112, 113 is adjusted by the wet etching method, and the silicon nitride film 111 and silicon oxide film 110 are eliminated by the wet etching method.

Figure 5C:
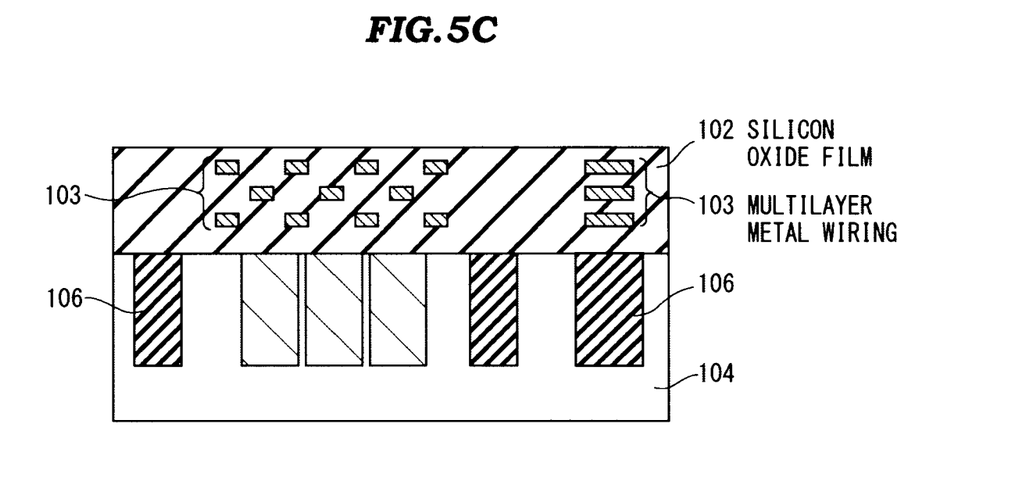

Next, as shown in FIG. 5C, photodiodes is formed in the silicon substrate 104 and a multilayer metal wiring 103 is formed on the silicon substrate 104 by the CVD method while the silicon oxide film 102 is deposited and the silicon oxide film 102 is planarized by the CMP method.

Figure 5D:
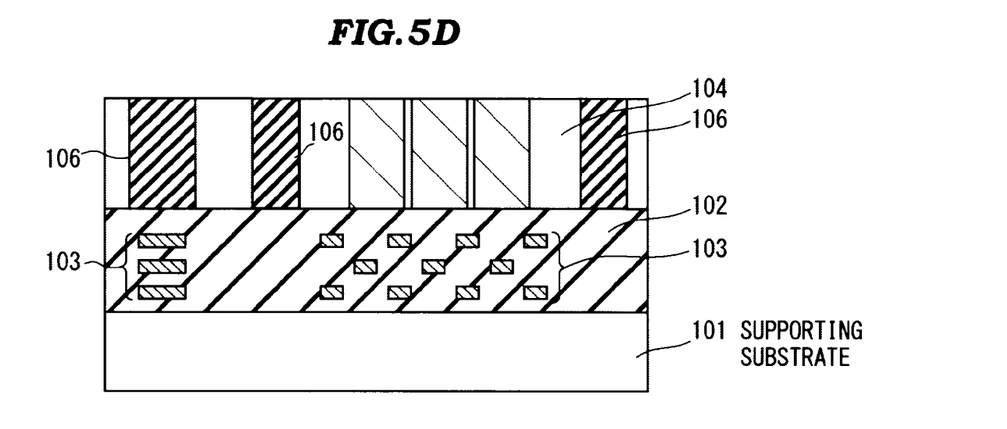

Next, as shown in FIG. 5D, the supporting substrate 101 is laminated to the silicon oxide film 102 planarized, after turned upside down, the silicon substrate 104 is reduced in thickness by the CMP method so as to expose the silicon oxide film 106.

Next, the resist pattern 115 having an opening at a place corresponding to the contact, whose area is smaller than that of the first hole 112, is formed on the silicon substrate 104 by the photolithographic method.

Figure 5E:
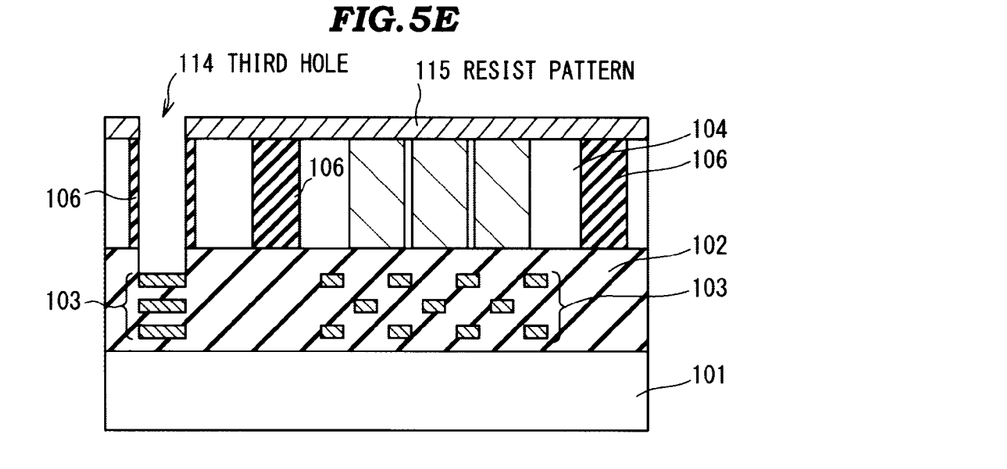

Next, as shown in FIG. 5E, the silicon oxide film 106 in the opening corresponding to the contact and the silicon oxide film 102 on the multilayer metal wiring 103 are etched by the RIE method so as to expose the multilayer metal wiring 103 and to form a third hole 114.

Figure 5F:
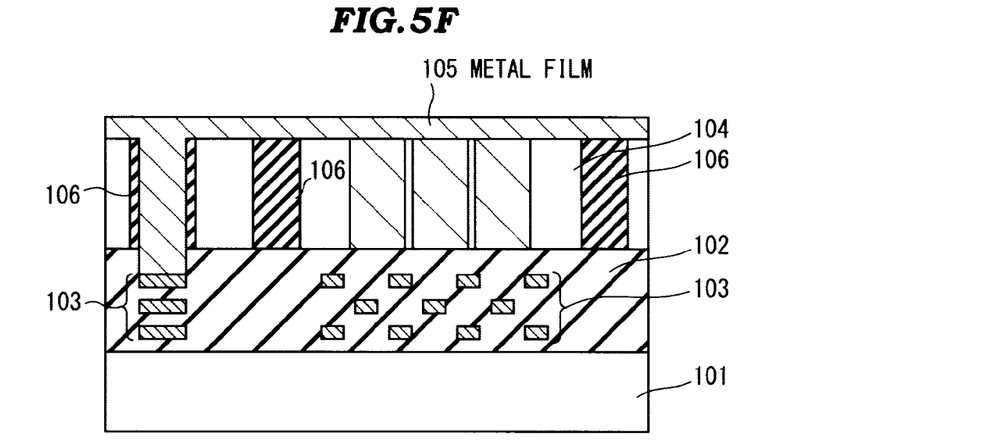

Next, as shown in FIG. 5F, the resist pattern 115 is eliminated, and a metal film 105 is formed on the third hole 114, the silicon substrate 104, and the silicon oxide film 106 by the CVD method.

Next, the metal film 105 on the silicon substrate 104 and the silicon oxide film 106 is eliminated by the CMP method, and a light receiving part 108 and a pad part 109 are formed by the known processes so as to obtain the solid-state image pickup device 100 shown in FIG. 4.

The solid-state image pickup device 100 according to the comparative example has the following problems.

(1) The depth from the surface of the silicon substrate 104 to the multilayer metal wiring 103 has to be etched when the multilayer metal wiring 103 is exposed, so that the silicon oxide film 106 around the third hole 114 is reduced in thickness than the desired thickness and it can not prevent the metal contained in the metal film 105 embedded from diffusing into the silicon substrate 104. Further, it is difficult to expose the multilayer metal wiring 103 exactly.

(2) The silicon oxide film 106 as the alignment mark has a small brightness difference from the silicon substrate 104 so that it is difficult to detect the silicon oxide film 106 as the alignment mark.

First Embodiment

Configuration of Solid-State Image Pickup Device

Figure 1:
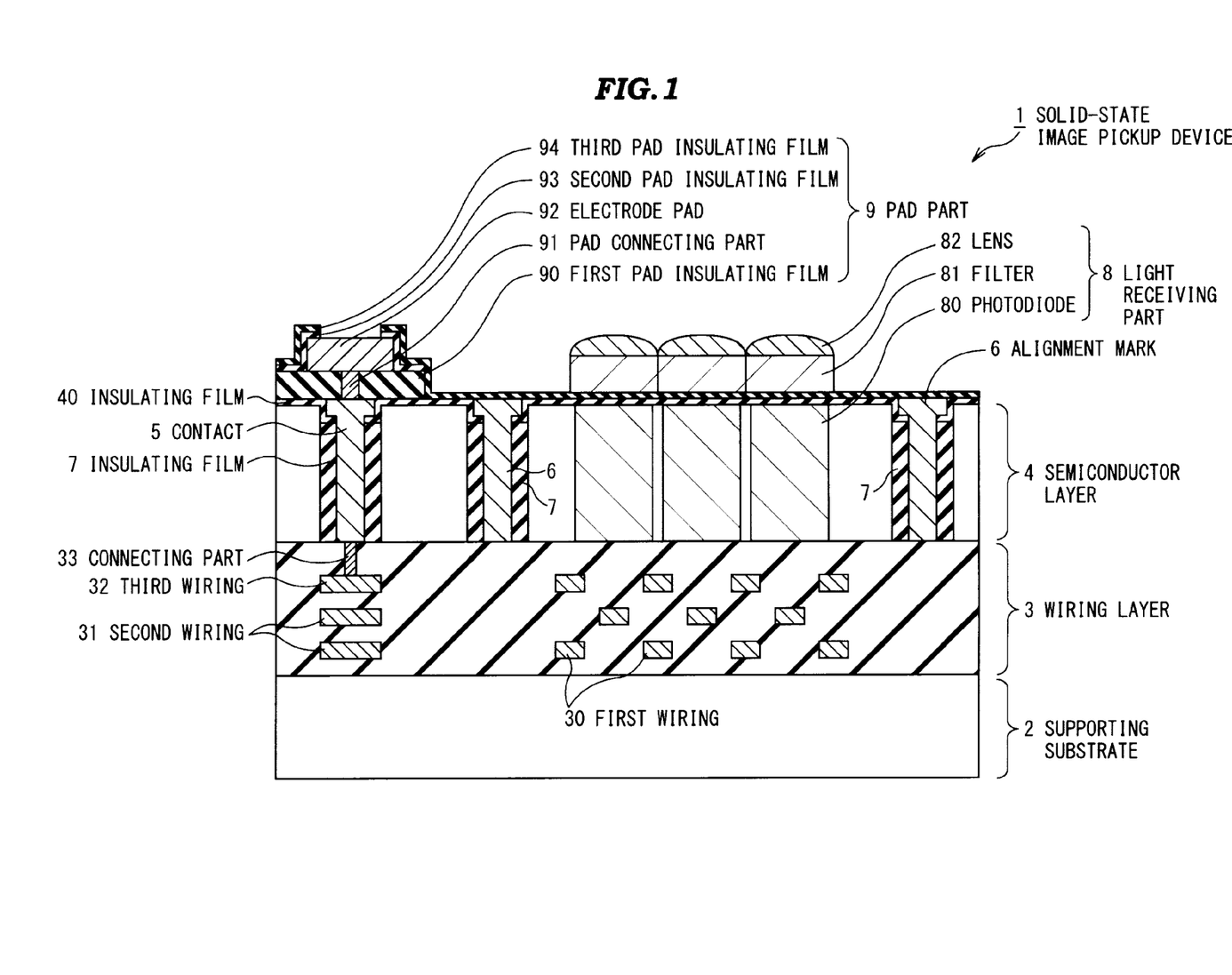
FIG. 1 is a cross-sectional view schematically showing a solid-state image pickup device according to a first embodiment.

FIG. 1 is a cross-sectional view schematically showing a solid-state image pickup device according to a first embodiment. The solid-state image pickup device is a rear plane irradiation type CMOS solid-state image pickup device.

As shown in FIG. 1, the solid-state image pickup device 1 is schematically configured to include a supporting substrate 2, a wiring layer 3 formed on the supporting substrate 2, a semiconductor layer 4 formed on the wiring layer 3, a contact 5 formed in the semiconductor layer 4, alignment marks 6 formed in the semiconductor layer 4, an insulating film 7 formed around the contact 5 and the alignment marks 6, a light receiving part 8 formed in the semiconductor layer 4, and a pad part 9 formed on the semiconductor layer 4.

The supporting substrate 2 is formed of, for example, a silicon based substrate including silicon as a main component.

The wiring layer 3 is schematically configured to include, in an interlayer insulating film described below, a first wiring 30 used as a wiring for pulling out a signal at a light receiving element, a second wiring 31 used as a wiring for pulling out a signal at a peripheral circuit, a third wiring 32 for connecting to a connecting part 33, and the connecting part 33.

As the first to third wirings 30, 31, 32, for example, a metal as a conducting material such as aluminum, copper, silver, tungsten and gold can be used. Further, a barrier metal for preventing metal diffusion can be formed around the metal. As the barrier metal, for example, a high melting point metal such as titanium, tantalum, a metal (titanium, tantalum) nitride or a metal (titanium, tantalum) nitriding silicide can be used.

One end portion of the connecting part 33 electrically connects to the contact 5 and the other end portion opposite to the one end portion electrically connects to the third wiring 32. As the connecting part 33, for example, a material as a conducting material different from the contact 5 such as aluminum, copper, silver, tungsten and gold is used. Further, the above-mentioned barrier metal can be formed around the connecting part 33.

The semiconductor layer 4 is formed of, for example, a silicon substrate including silicon as a main component.

The contact 5 is formed by that the conducting material is embedded in holes formed in the semiconductor layer 4 and the insulating film 7 is formed around the contact 5. As the conducting material embedded in the embodiment, for example, a conducting material including polycrystal silicon as a main component can be used.

The alignment marks 6 is formed by that the same conducting material as that of the contact 5 is embedded in holes formed in the semiconductor layer 4 and the insulating film 7 is formed around the alignment marks 6. As the conducting material embedded in the embodiment, for example, a conducting material including polycrystal silicon as a main component can be used.

The alignment marks 6 is a mark used for, for example, alignment between a pattern formed on a wafer and a mask pattern in the side of an exposure device in a process for transferring the mask pattern onto the wafer.

As the insulating film 7, for example, a film having insulating properties such as a silicon oxide film, a silicon nitride film can be used.

The light receiving part 8 is schematically configured to include photodiodes 80 formed in the semiconductor layer 4, which is a light receiving element for converting a light signal into an electrical signal by absorption of light, filters 81 formed on the photodiodes 80, which is disposed with respect to each of light's three primary colors (RGB), or with respect to each of complementary colors, namely, Cyan, Magenta, Yellow, and Green (CMYG), and lenses 82 formed on the filter 81.

The pad part 9 is schematically configured to include a first pad insulating film 90 formed on the semiconductor layer 4, a pad connecting part 91 formed in the pad insulating film 90, whose end portion electrically connects to the contact 5, an electrode pad 92 electrically connects to the pad connecting part 91, a second pad insulating film 93 formed around the electrode pad 92 and on the first pad insulating film 90, and the third pad insulating film 94 formed so as to cover the surface of the semiconductor layer 4 and the first and second pad insulating films 90, 93.

As the first to third pad insulating films 90, 93, 94, for example, a film having insulating properties such as a silicon oxide film, a silicon nitride film can be used.

As the pad connecting part 91, for example, a metal as a conducting material such as aluminum, copper, silver, tungsten and gold can be used.

As the electrode pad 92, for example, a metal as a conducting material such as aluminum, copper, silver, tungsten and gold can be used.

Hereinafter, an example of a method of manufacturing a solid-state image pickup device according to the embodiment will be explained.

(Manufacturing of Solid-State Image Pickup Device)

Figure 2A:
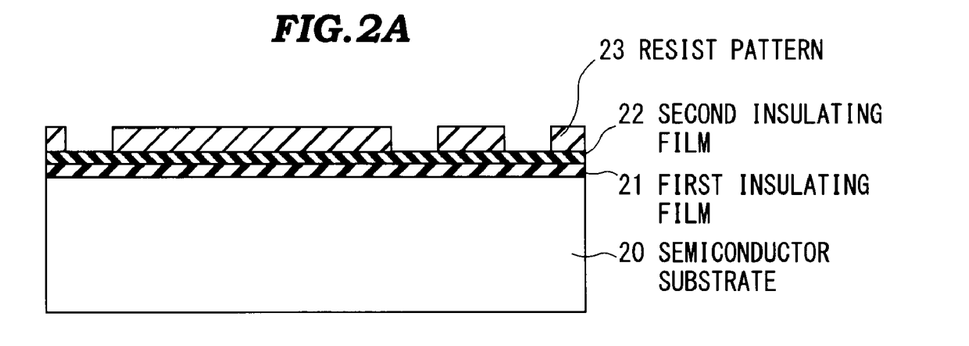
FIGS. 2A to 2R are cross-sectional views schematically showing a manufacturing process of the solid-state image pickup device according to the first embodiment.
Figure 2B:
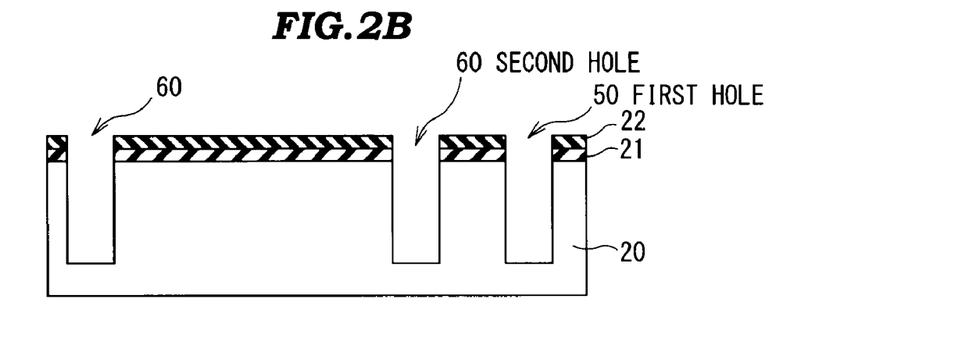
Figure 2C:
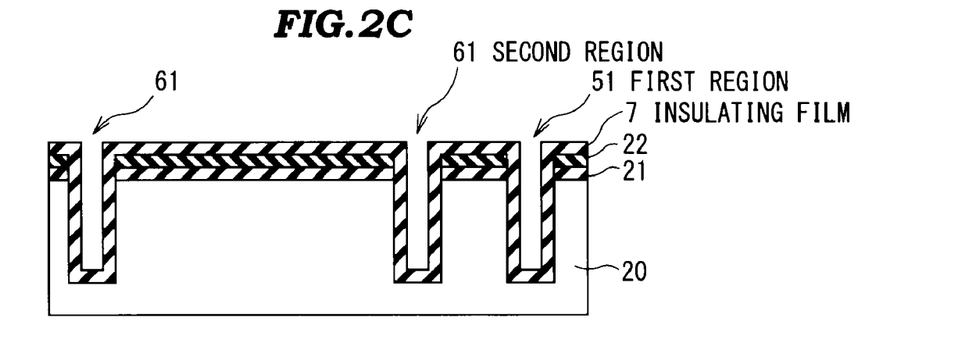
Figure 2D:
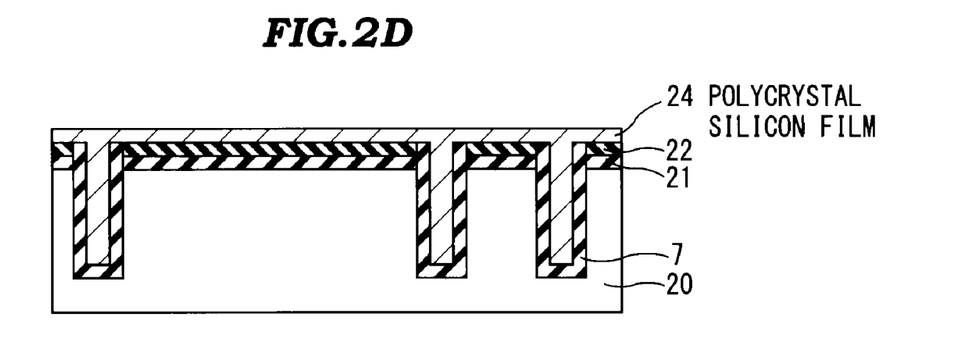
Figure 2E:
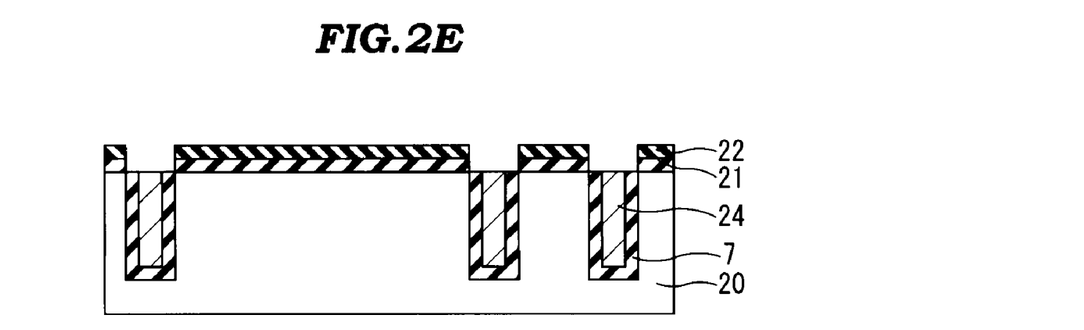
Figure 2F:
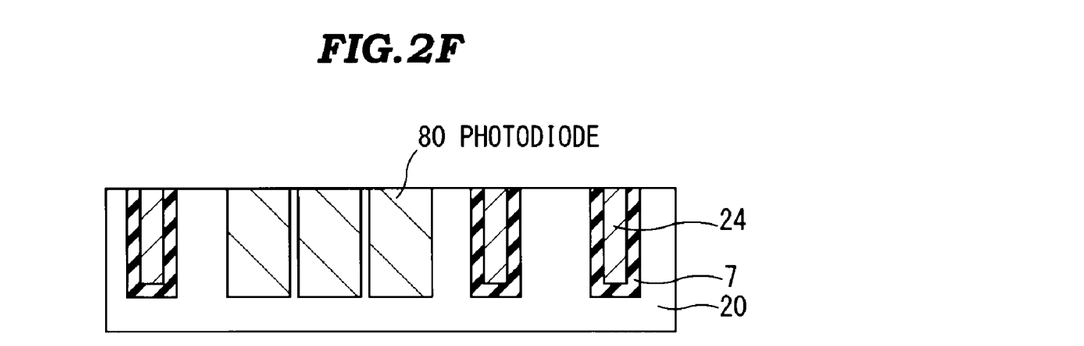
Figure 2G:
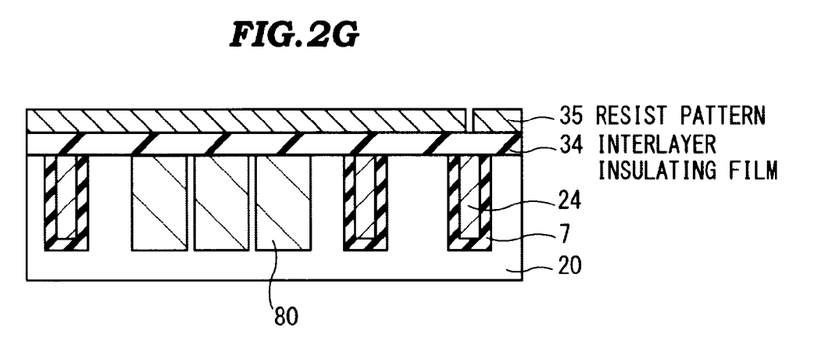
Figure 2H:
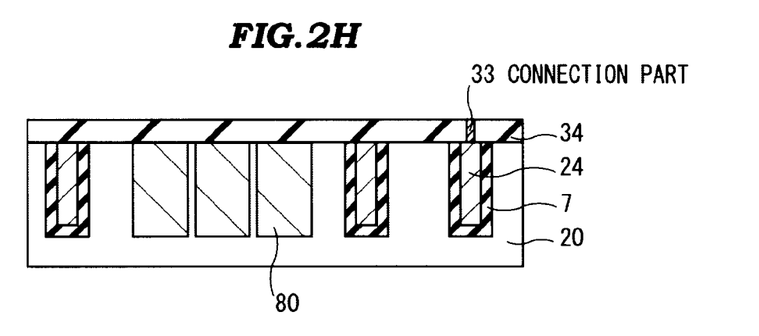
Figure 2I:
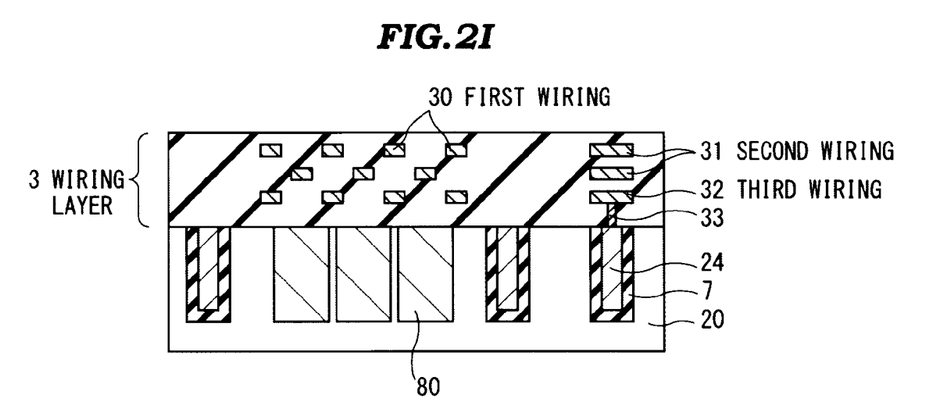
Figure 2J:
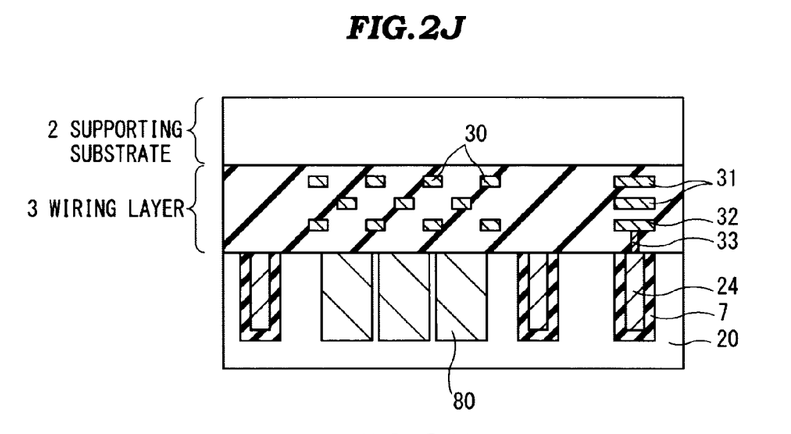
Figure 2K:
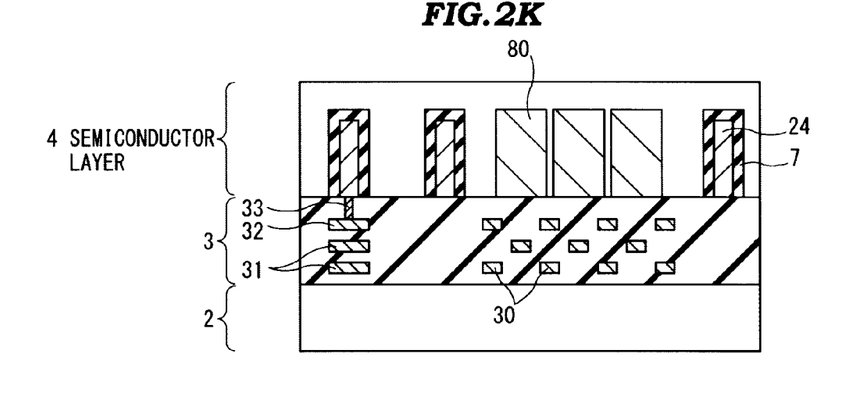
Figure 2L:
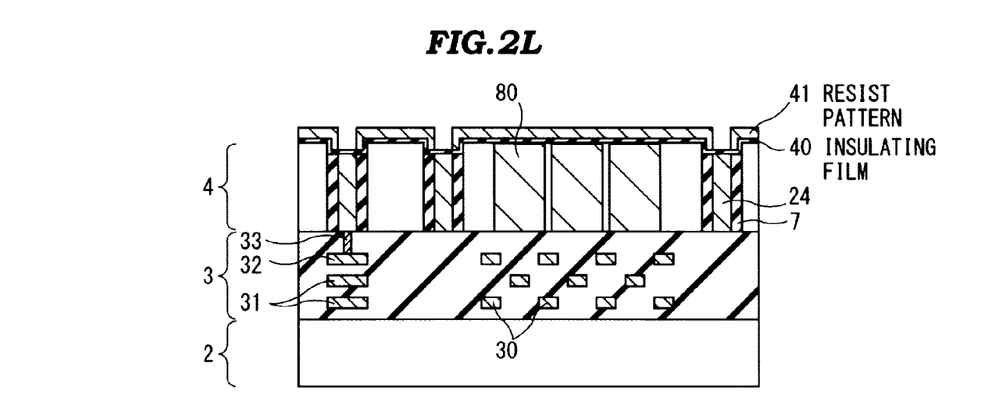
Figure 2M:
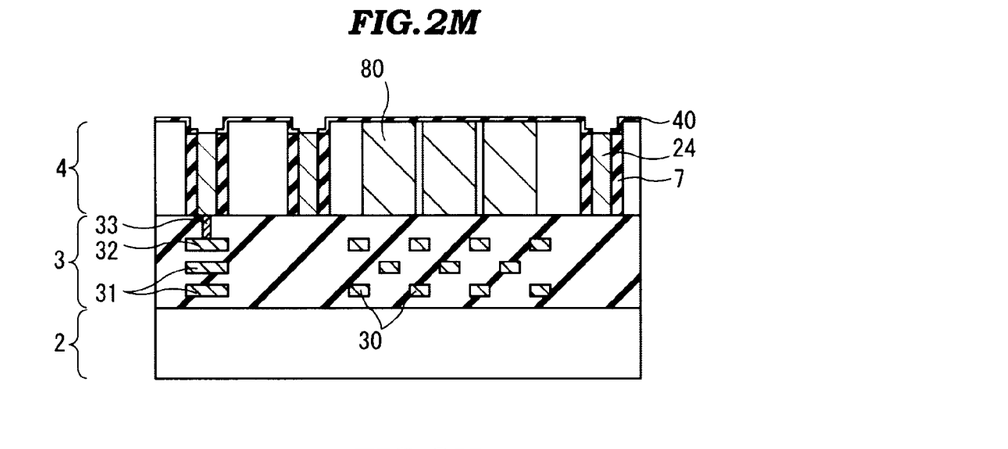
Figure 2N:
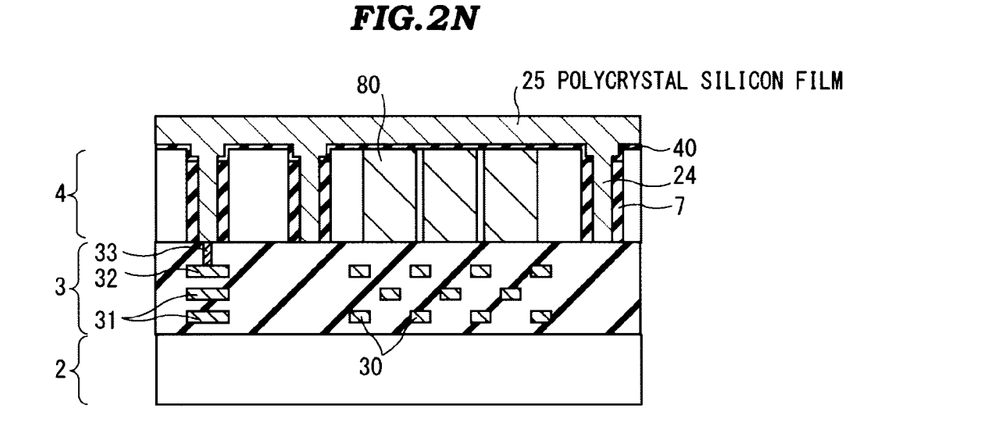
Figure 2O:
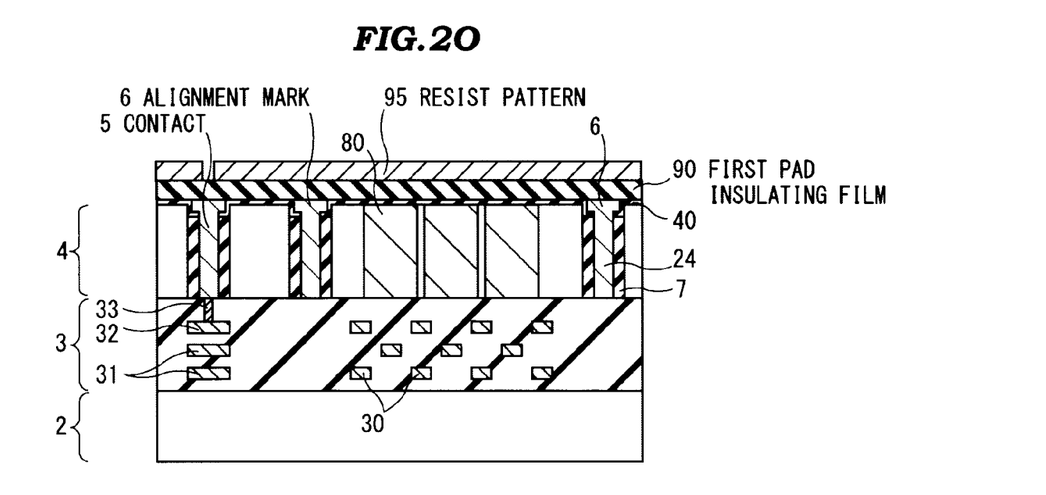
Figure 2P:
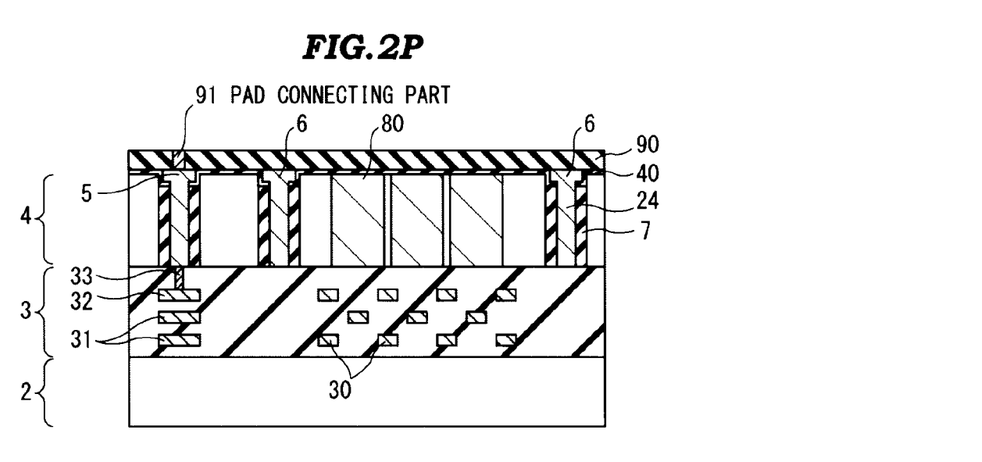
Figure 2Q:
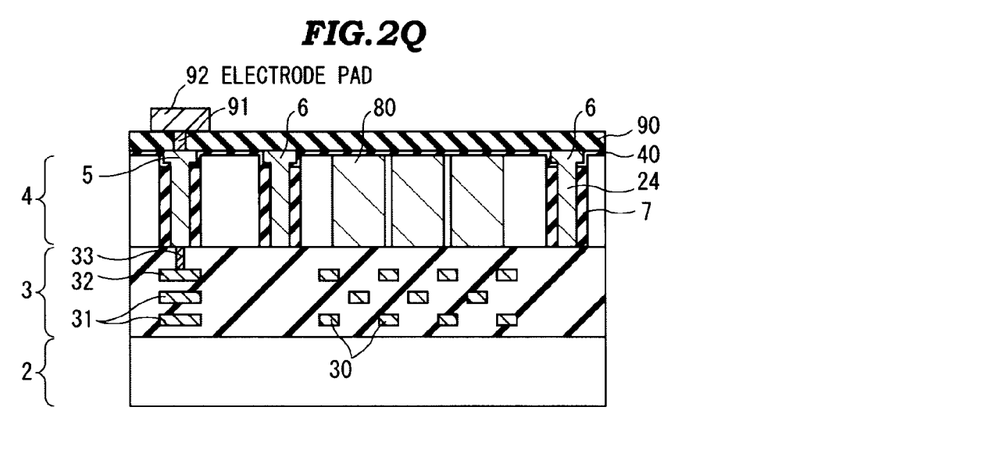
Figure 2R:
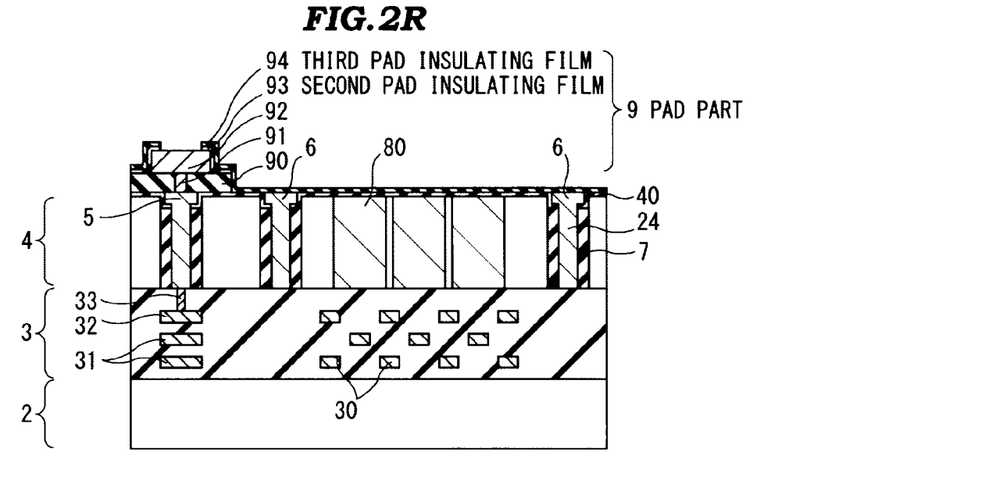

FIGS. 2A to 2R are cross-sectional views schematically showing a manufacturing process of the solid-state image pickup device according to the first embodiment.

First, a silicon oxide film is formed on a semiconductor substrate 20 by an oxidation method or the CVD method so as to form a first insulating film 21. Subsequently, a silicon nitride film is formed on the first insulating film 21 by the CVD method so as to form a second insulating film 22.

Next, as shown in FIG. 2A, a resist pattern 23 which has a pattern corresponding to the contact 5 and the alignment marks 6 is formed on the second insulating film 22 by a photolithographic method.

Next, as shown in FIG. 2B, first and second holes 50, 60 are formed in the semiconductor substrate 20, where the first hole 50 is formed in a place corresponding to the contact 5 and the second holes 60 is formed in a place corresponding to the alignment marks 6. Particularly, the first and second insulating films 21, 22 are etched by the RIE method under conditions selective to the resist pattern 23. Subsequently, the resist pattern 23 is eliminated, and the semiconductor substrate 20 is etched by the RIE method under conditions selective to the second insulating film 22 so as to form the first and second holes 50, 60.

Next, as shown in FIG. 2C, a silicon oxide film is deposited on the surface of the second insulating film 22 and the surfaces of the first and second holes 50, 60 by the CVD method so as to form the insulating film 7.

Here, the insulating film 7 is deposited on the surface of the first hole 50 so that a first region 51 is formed, which is enclosed with the insulating film 7 in the first hole 50, and the insulating film 7 is deposited on the surface of the second holes 60 so that a second region 61 is formed, which is enclosed with the insulating film 7 in the second hole 60.

Next, the insulating film 7 on the second insulating film 22 is eliminated by the CMP method.

Next, as shown in FIG. 2D, a polycrystal silicon film 24 is embedded in the first and second regions 51, 61 by the CVD method. Further, when a silicon crystal is grown so as to become the polycrystal silicon film 24, simultaneously, an n-type impurity is implanted into the silicon crystal by the in-situ doping method. As the n-type impurity, for example, phosphorus can be used. Subsequently, the polycrystal silicon film 24 on the second insulating film 22 is eliminated by the CMP method.

Next, as shown in FIG. 2E, the insulating film 7 and the polycrystal silicon film 24 are etched so as to have the same height as the surface of the semiconductor substrate 20 by the RIE method under conditions selective to the second insulating film 22. Subsequently, the first and second insulating films 21, 22 are eliminated by a wet etching method.

Next, as shown in FIG. 2F, photodiodes 80 are formed in the semiconductor substrate 20.

Next, as shown in FIG. 2G, an interlayer insulating film 34 is formed on the semiconductor substrate 20 by the CVD method, and subsequently, a resist pattern 35 which has a pattern corresponding to the contact 5 is formed by the photolithographic method. The interlayer insulating film 34 includes a low-k film having a small dielectric constant in order to form the wiring layer 3 in which wirings are forming. As the interlayer insulating film 34, for example, a silicon oxide film, a fluorine addition silicon oxide film (F addition $SiO_2$), a carbon containing silicon oxide film (SiOC), an organic low-k film formed of an organic material, a porous low-k film formed by introducing holes into the low-k film and a laminated film formed by combining the above-mentioned plural films can be used.

Next, holes which reach the polycrystal silicon film 24 are formed in the interlayer insulating film 34 by the RIE method under conditions selective to the resist pattern 35, and the resist pattern 35 is eliminated.

Next, as shown in FIG. 2H, a tungsten film is diposited on the interlayer insulating film 34 by the CVD method so as to form a connection part 33. Subsequently, the tungsten film on the interlayer insulating film 34 is eliminated by the CMP method.

Next, as shown in FIG. 2I, the first to third wirings 30, 31, 32 are formed while stacking the interlayer insulating film 34 in layers, and the surface thereof is planarized by the CMP method so as to form the wiring layer 3. Further, it is also adopted that the wiring layer 3 is preliminarily formed by the other process and it is laminated to the semiconductor substrate 20. Furthermore, the forming of the first to third wirings 30, 31, 32 can include a process of forming a barrier metal made of titanium, tantalum, a metal (titanium, tantalum) nitride or a metal (titanium, tantalum) nitriding silicide around the first to third wirings 30, 31, 32.

Next, as shown in FIG. 2J, the supporting substrate 2 is laminated on the wiring layer 3.

Next, as shown in FIG. 2K, the semiconductor substrate 20 on which the wiring layer 3 and the supporting substrate 2 are formed is turned upside down, and the semiconductor substrate 20 is used as the semiconductor layer 4.

Next, as shown in FIG. 2L, the semiconductor layer 4 is reduced in thickness until the insulating film 7 is exposed, and the exposed insulating film 7 is etched by the wet etching method so as to expose the polycrystal silicon film 24. Subsequently, a silicon oxide film is deposited on the semiconductor layer 4 by the CVD method so as to form an insulating film 40, and a resist pattern 41 having a pattern corresponding to the contact 5 and the alignment marks 6 is formed on the insulating film 40. Particularly, for example, the semiconductor layer 4 is reduced in thickness by using the RIE method, the wet etching method, the CMP method or the like. Further, the resist pattern 41 having holes whose area is smaller than that of the holes of the contact 5 and the alignment marks 6 is formed by the photolithographic method.

Next, as shown in FIG. 2M, the polycrystal silicon film 24 is exposed by the RIE method under conditions selective to the insulating film 40 and the resist pattern 41 is eliminated.

Next, as shown in FIG. 2N, a polycrystal silicon film 25 is formed on the polycrystal silicon film 24 and the insulating film 40 by the CVD method.

Next, as shown in FIG. 2O, the polycrystal silicon film 25 on the insulating film 40 is eliminated by the CMP method, and the contact 5 and the alignment marks 6 are formed. Subsequently, a silicon oxide film is deposited on the contact 5, the alignment marks 6 and the insulating film 40 by the CVD method so as to form a first pad insulating film 90. Subsequently, a resist pattern 95 having a pattern corresponding to the contact 5 is formed by the photolithographic method.

Next, a through hole which reaches the contact 5 is formed in the first pad insulating film 90 by the RIE method under conditions selective to the resist pattern 95 and the resist pattern 95 is eliminated.

Next, as shown in FIG. 2P, a pad connecting part 91 for connecting to the contact 5 is formed in the first pad insulating film 90. Particularly, a tungsten film is deposited on the first pad insulating film 90 by the CVD method, and the tungsten film on the first pad insulating film 90 is eliminated by the CMP method so as to form the pad connecting part 91.

Next, as shown in FIG. 2Q, an electrode pad 92 is formed on the first pad insulating film 90. Particularly, an aluminum film is formed on the first pad insulating film 90 by a sputtering method and a resist pattern having a pattern corresponding to the electrode pad 92 is formed by the photolithographic method. Subsequently, the aluminum film is etched by the RIE method under conditions selective to the resist pattern until the first pad insulating film 90 is exposed, and the resist pattern is eliminated so as to form the electrode pad 92.

Next, as shown in FIG. 2R, a pad part 9 is formed. Particularly, a silicon oxide film is deposited on the first pad insulating film 90 and the electrode pad 92 by the CVD method so as to form a second pad insulating film 93. Subsequently, a resist pattern larger than the electrode pad 92 is formed on the second pad insulating film 93 by the photolithographic method, and the second pad insulating film 93 and first pad insulating film 90 are eliminated by the wet etching method under conditions selective to the resist pattern. Subsequently, a silicon nitride film is deposited on the insulating film 40 and the second pad insulating film 93 by the CVD method so as to form a third pad insulating film 94. Subsequently, a resist pattern is formed on the electrode pad 92 by the photolithographic method, the resist pattern having a pattern which is capable of forming holes smaller than the electrode pad 92, and the second and third pad insulating films 93, 94 on the electrode pad 92 are etched by the RIE method under conditions selective to the resist pattern so that the electrode pad 92 is exposed, and the resist pattern is eliminated.

Next, a pattern formed on a wafer and a mask pattern in the side of an exposure device are aligned based on the alignment marks 6, and filters 81 and lenses 82 are sequentially formed so as to obtain the solid-state image pickup device 1 shown in FIG. 1.

(Advantages of First Embodiment)

According to the first embodiment, the following advantages can be obtained.

(1) The contact and the alignment mark are simultaneously formed so that number of processes can be reduced in comparison with a case that they are separately formed.

(2) The alignment mark around which the insulating film is formed has a large brightness difference from the semiconductor substrate in comparison with a case that the insulating film is not formed so that the alignment mark can be easily distinguished by the exposure device.

(3) The alignment mark is easily distinguished so that accuracy of alignment can be improved when the filters and the lenses are formed and process yield can be also enhanced.

(4) The polycrystal silicon is used as the alignment mark so that metal diffusion to the semiconductor substrate can be prevented. The metal diffusion to the semiconductor substrate is prevented so that scattering of incident light due to the metal diffusion can be prevented and performance of the solid-state image pickup device can be enhanced.

(5) The connection part is formed in a state that the polycrystal silicon which becomes the contact has been already embedded, after that, the wiring layer is formed so that the process can be simplified in comparison with a case that deep holes for forming the contact and the connection part are formed in the semiconductor substrate.

Second Embodiment

Hereinafter, a second embodiment will be explained. The embodiment is different from the first embodiment in terms of using a metal as a material for forming the contact and the alignment mark. Further, in the embodiment, with regard to elements having the same construction and function as the first embodiment, the same references as those of the first embodiment are used, and the explanation is omitted. Furthermore, with regard to the same processes as those of the first embodiment the explanation is also omitted.

(Manufacturing Process of Solid-State Image Pickup Device)

Figure 3A:
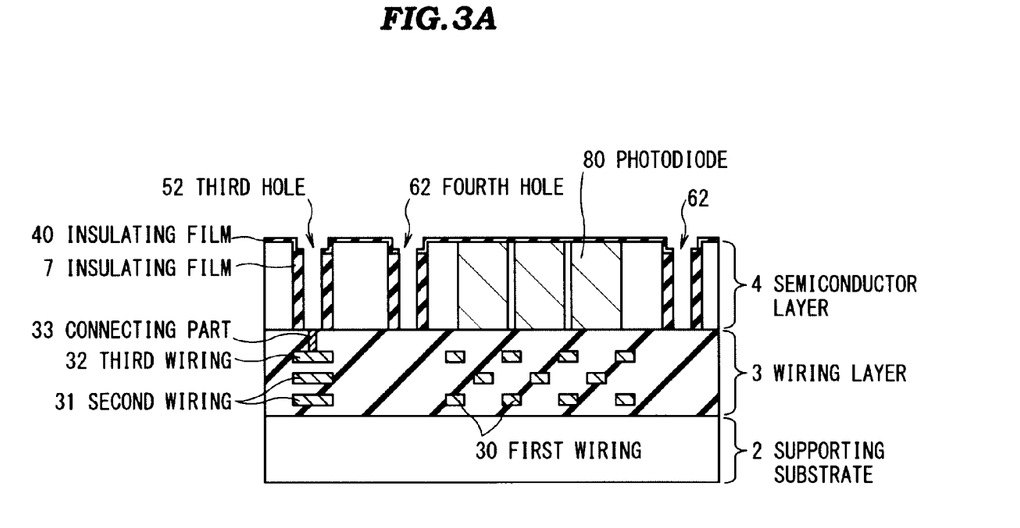
FIGS. 3A to 3B are cross-sectional views schematically showing a manufacturing process of the solid-state image pickup device according to a second embodiment.
Figure 3B:
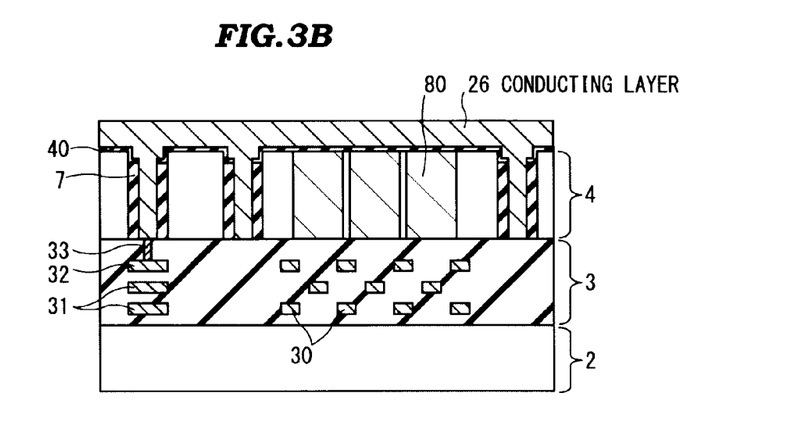

FIGS. 3A to 3B are cross-sectional views schematically showing a manufacturing process of the solid-state image pickup device according to the second embodiment.

First, the processes until the polycrystal silicon film 24 embedded in the first and second regions 51, 61 is exposed, which has been explained by using FIGS. 2A to 2M showing the first embodiment, are carried out.

Next, as shown in FIG. 3A, the polycrystal silicon film 24 is etched by the wet etching method under conditions selective to the insulating film 40 so as to form a third hole 52 corresponding to the contact and fourth holes 62 corresponding to the alignment marks 6 are formed.

Next, as shown in FIG. 3B, a conducting layer 26 is deposited on the insulating film 40 by the CVD method so as to embed the conducting layer 26 in the third and fourth holes 52, 62. The conducting layer 26 is, for example, a metal such as aluminum, titanium, copper, silver, tantalum, tungsten and gold, or a metal compound thereof. The metal compound is, for example, silicide or nitride of the metal.

Next, the conducting layer 26 on the insulating film 40 is eliminated by the CMP method so as to form the contact 5 and the alignment marks 6. Subsequently, the processes explained by using FIGS. 2O to 2R are carried out so as to obtain the solid-state image pickup device 1 shown in FIG. 1.

(Advantages of Second Embodiment)

According to the second embodiment, the following advantages can be obtained.

(1) The alignment mark formed of metal has a large brightness difference from the semiconductor substrate in comparison with a case that the alignment mark is formed of the materials other than the metal so that the alignment mark can be easily distinguished by the exposure device. Further, the insulating film is formed around the alignment mark so that the alignment mark can be more easily distinguished by the exposure device.

(2) The alignment mark is easily distinguished so that accuracy of alignment can be improved when the filters and the lenses are formed and process yield can be also enhanced.

(3) The periphery of the alignment mark is enclosed with the insulating film so that metal diffusion to the semiconductor substrate can be prevented. The metal diffusion to the semiconductor substrate is prevented so that scattering of incident light due to the metal diffusion can be prevented and performance of the solid-state image pickup device can be enhanced.

(4) The connection part is formed in a state that the polycrystal silicon which becomes the contact has been already embedded, after that, the wiring layer is formed so that the process can be simplified in comparison with a case that deep holes for forming the contact and the connection part are formed in the semiconductor substrate.

Further, it should be noted that the present invention is not intended to be limited to the above-mentioned embodiment, and the various kinds of changes thereof can be implemented by those skilled in the art without departing from the gist of the invention.

What is claimed is:

1. A method of manufacturing a solid-state image pickup device, comprising:
   forming first and second holes in a semiconductor substrate;
   forming insulating films on surfaces of the first and second holes;
   forming a contact and an alignment mark by simultaneously embedding a conducting material in the first and second holes;
   forming a photodiode in the semiconductor substrate;
   forming a wiring layer including a connecting part for connecting to the contact and a wiring for connecting to the connecting part;
   bonding a supporting substrate on the wiring layer; exposing the contact and the alignment mark on the surface of the semiconductor substrate by reducing the semiconductor substrate in thickness; and
   forming a filter and a lens on the photodiode based on the alignment mark.

2. The method of manufacturing a solid-state image pickup device according to claim 1, wherein the contact and the alignment mark are formed by embedding the conducting material including polycrystal silicon as a main component.

3. The method of manufacturing a solid-state image pickup device according to claim 2, wherein the contact and the alignment mark are formed by embedding the conducting material, and simultaneously implanting an n-type impurity into the conducting material by in-situ doping method.

4. The method of manufacturing a solid-state image pickup device according to claim 3, wherein the insulating films is formed by forming a silicon oxide film or a silicon nitride film on the surfaces of the first and second holes.

5. The method of manufacturing a solid-state image pickup device according to claim 4, wherein the connecting part is formed by embedding a metal selected from the group consisting of aluminum, copper, silver, tungsten and gold.

6. The method of manufacturing a solid-state image pickup device according to claim 5, wherein the wiring is formed by embedding a metal selected from the group consisting of aluminum, copper, silver, tungsten and gold.

7. The method of manufacturing a solid-state image pickup device according to claim 6, wherein the wiring is formed by forming a barrier metal including titanium, tantalum, a metal (titanium, tantalum) nitride or a metal (titanium, tantalum) nitriding silicide.

8. The method of manufacturing a solid-state image pickup device according to claim 1, wherein after the contact and the alignment mark are exposed on the surface of the semiconductor substrate, an other conducting material is newly embedded in place of the conducting material previously embedded as the contact and the alignment mark, and then the filter and the lens are formed.

9. The method of manufacturing a solid-state image pickup device according to claim 8, wherein a metal or a metal compound is newly embedded as the other conducting material.

* * * * *